United States Patent [19]

McHugh et al.

[11] Patent Number: 4,751,059
[45] Date of Patent: Jun. 14, 1988

[54] APPARATUS FOR GROWING DENDRITIC WEB CRYSTALS OF CONSTANT WIDTH

[75] Inventors: James P. McHugh, Wilkins Twp., Allegheny Co.; Raymond G. Seidensticker, Forest Hills; Charles S. Duncan, Penn Hills Twp., all of Pa.

[73] Assignee: Westinghouse Electric Corp., Pittsburgh, Pa.

[21] Appl. No.: 938,651

[22] Filed: Dec. 5, 1986

[51] Int. Cl.$^4$ ............................................ C30B 15/34
[52] U.S. Cl. ............................ 422/249; 156/DIG. 84; 156/DIG. 88
[58] Field of Search ................... 156/601, 608, 617 R, 156/617 M, 621, 622, 624, DIG. 64, DIG. 88, DIG. 84; 427/93; 422/246, 249

[56] References Cited

U.S. PATENT DOCUMENTS

| | | | |
|---|---|---|---|
| 3,511,610 | 5/1970 | Dohmen | 422/249 |
| 3,617,223 | 11/1971 | Boatman | 156/DIG. 88 |
| 4,184,907 | 1/1980 | Yates | 422/246 |
| 4,217,165 | 8/1980 | Ciszek | 156/608 |
| 4,239,734 | 12/1980 | Ciszek | 422/246 |
| 4,271,129 | 6/1981 | Berkman et al. | 422/246 |
| 4,289,571 | 9/1981 | Jewett | 156/617 H |
| 4,402,786 | 9/1983 | Little | 156/608 |

OTHER PUBLICATIONS

Seidensticker, "Dendritic Web Growth of Silicon", Crystals 8(1982), pp. 157–158.
Seidensticker and Hopkins, "Silicon Ribbon Growth by the Dendritic Web Process", Journal of Crystal Growth 50(1980), pp. 222–223.
Barrett, et al., Growth of Wide, Flat Crystals of Silicon Web, 118 Journal of the Electrochemical Society, 952–957 (1971).

Primary Examiner—John Doll
Assistant Examiner—R. Bruce Breneman

[57] ABSTRACT

The concept of this invention is to provide a thermal geometry which produces web growth at a constant width by balancing the heat loss pattern from the growing dendrites in such a manner that the outer requirements for stable web growth are simultaneously met. This is accomplished by configuring the geometry of the growth system such that the heat loss pattern from the growing web, the heat loss pattern from the growing dendrites, and the temperature profile in the melt can each be controlled independently and simultaneously optimized.

2 Claims, 4 Drawing Sheets

HEAT LOSS

1 CM

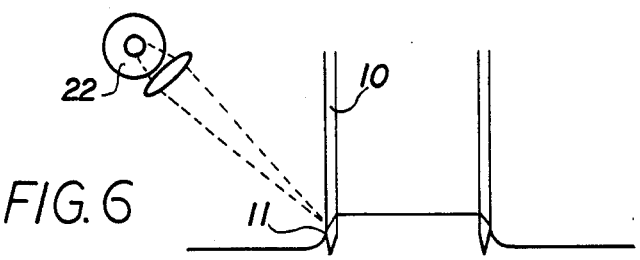
FIG. 6
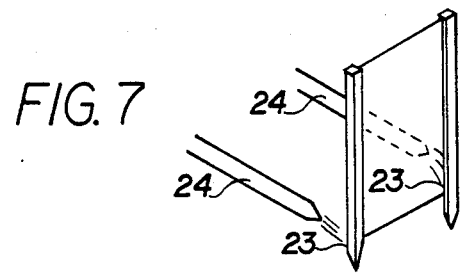
FIG. 7
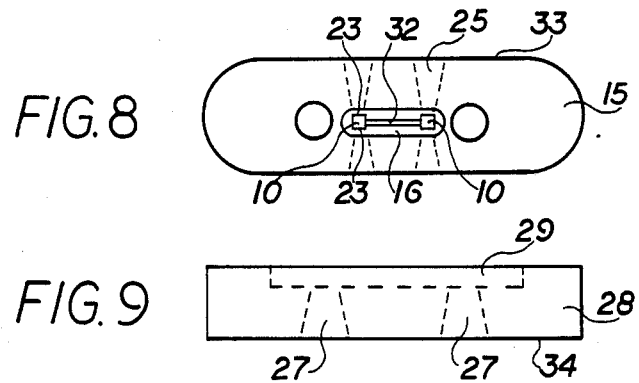
FIG. 8
FIG. 9

APPARATUS FOR GROWING DENDRITIC WEB CRYSTALS OF CONSTANT WIDTH

FIELD OF THE INVENTION

The present invention relates to an apparatus for growing silicon dendritic-web crystals of constant width.

BACKGROUND OF THE INVENTION

Silicon dendritic-web crystals are long, thin ribbons of single crystalline material of high structural quality which can be grown in the (111) orientation. The current impetus for developing silicon dendritic-web is its application to the production of low-cost, highly efficient solar cells for direct conversion of sunlight to electrical energy. The thin ribbon form of the crystal requires little additional processing prior to device fabrication, in contrast to wafer substrates from the more traditional Czochralski crystal which must be sliced, lapped and polished prior to use, a costly process even though large volume economies are practiced. Additionally, the rectangular shape of the silicon ribbon leads to efficient packing of individual cells into large modules and arrays of solar cells.

FIG. 2 shows a typical system used for dendritic-web crystal growth. As shown, a susceptor 28 having a susceptor cavity 29 contains a crucible 30 containing molten polycrystalline silicon 31. A susceptor lid 15 is positioned over the crucible/susceptor system. The susceptor lid 15 contains a slot 16 through which dendritic web crystals 32 can be pulled. As shown, the dendritic web crystal 32 is bounded by a bounding dendrite 10 which is immersed in the molten polycrystalline silicon 31. Also shown in FIG. 2 are radiation shields 20 spaced above the lid 15. As shown, the radiation shields 20 also contain slots 16 through which the dendritic web crystal 32 may be pulled.

For technical and economic reasons it is highly desirable that these ribbons be grown at a predetermined, fixed width which matches the requirements for ultimate fabrication into semiconductor devices, such as solar cells. In most of the growth configurations which have been used until now, the growing dendritic web continuously widens until the crystal deforms under the influence of thermal stresses. The physical mechanisms involved in the widening of the dendritic web can be readily understood from the schematic diagram in FIG. 1. The bounding dendrites 20 propogate in very nearly a [211] crystallographic direction as the result of the crystallographic symmetry considerations of the reentrant corner twin plane mechanism. This growth symmetry of the bounding dendrites is perturbed, however, by the lateral temperature gradients generated by the lateral heat loss as indicated in FIG. 1. Heat loss around the dendrites 10 is asymmetrical, being greater at the outside edges 11 and less at the dendrite faces 23 and inside edges 12. As a result of these gradients, the dendrites grow slightly more on their outside edges 11 than on the inside edges 12 with the result that the web crystal widens as it grows longer. Also as shown in FIG. 1 is an intrinsic temperature profile at the surface of the melt, a profile resulting from heat loss through the slots and holes in the lid which covers the susceptor as in the typical growth system shown in FIG. 2. Theoretically, growth at a constant width will result if the temperature gradient resulting from the lateral heat loss is balanced by a temperature gradient resulting from the intrinsic melt profile. In principal, it should be possible to control the width of a growing dendritic web crystal by changing the system temperature so that the crystal grows at the appropriate position in its "thermal trough." Indeed, it has been possible to control the width of the dendritic web by such a technique. However, in practice it has been found that the required balance is so critical that any slight temperature fluctuation will cause the dendrite to stop growing and the crystal pulls out of the melt.

SUMMARY OF THE INVENTION

The present invention discloses a growth configuration that controls the thermal geometry of the system so that the resulting web crystals maintain their width over most of their length. The design considerations for this system represent an extension and refinement of the thermal requirements previously described. These requirements may be rephrased by stating that constant width growth will result when an axially symmetric temperature distribution is generated around the dendrite tip; the portion of the bounding dendrite totally surrounded by liquid. In the situation described in the previous section where constant width growth was obtained by balancing the asymmetric heat loss near the dendrite tip with the intrinsic temperature profile in the melt, an effective temperature symmetry was obtained by balancing two rather large quantities. Any slight variation of either of these quantities would not only destroy the balance, but also bring the thermoconditions into a condition where the dendrite growth was unstable: It would either cease to grow ("pull out") or generate other dendrites ("thirds"). Our present solution uses additional factors to help create a symmetrical heat loss situation so that the growth is much more stable and more easily controlled in a practical situation. One particular means of doing this is to widen the growth slot in the susceptor lid so that it is approximately circular with the dendrite as the access. Such a geometry gives a more symmetric heat loss pattern from the region near the dendrite tip and encourages non-deviant growth, i.e., constant width web.

This geometry must be compatible with the other web growth requirements. The growth of the web section of the crystal has its own thermal requirments and these must be accommodated, generally by a relatively narrow slot and shield configuration. Further, uniform growth of the web requires a relatively flat intrinsic temperature profile in the melt. An accommodation of all of these requirements has been accomplished in one embodiment of our invention: a slot configuration which is narrow over much of its length to provide proper growth of the web section; enlarged slot ends to provide symmetry of heat loss around the dendrites; and separated openings away from the slot that control the intrinsic melt temperature profile.

The intrinsic melt profile should be flat, but not over an indefinite region. Perfect heat loss symmetry around the dendrites cannot be obtained because of the presence of the web and the meniscus below it. Therefore, some compensating gradient is still required in the melt temperature profile. This gradient can be quite small, however, with the practical result that only relatively small heat flow quantities are balanced and any small deviations from the balance point still permits stable growth without either "pull out" or "third" generation.

BRIEF DESCRIPTION OF THE DRAWINGS

In the accompanying drawings, the preferred embodiments of the invention and preferred methods of practicing the invention are illustrated in which:

FIG. 6 is a schematic diagram which demonstrates another method of practicing the present invention using a radiative heat source.

FIG. 7 is a schematic diagram which demonstrates another method of practicing the present invention using gas jets.

FIG. 8 is a top view of a susceptor lid which demonstrates another method of practicing the present invention.

FIG. 9 is a side elevation of a susceptor which demonstrates another method of practicing the present invention.

DESCRIPTION OF THE PREFERRED EMBODIMENTS

Figure 1:
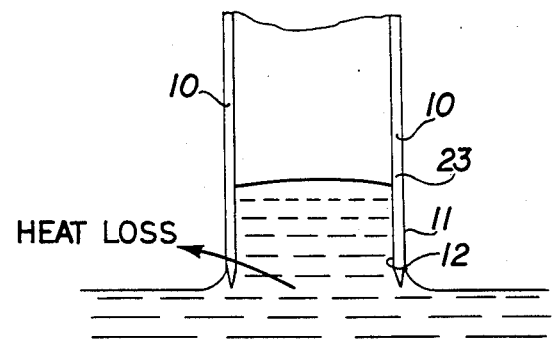
FIG. 1 is a schematic diagram demonstrating a dendritic web crystal being pulled from the melt. Also shown in FIG. 1 is an intrinsic temperature profile at the surface of the melt.
Figure 1:
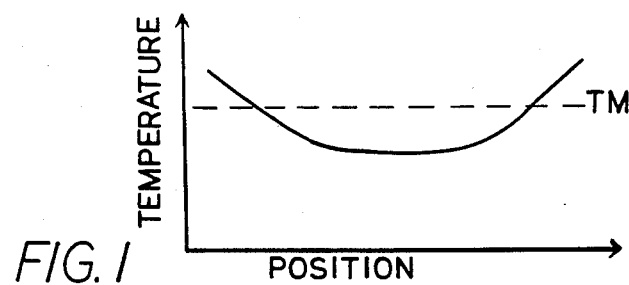
Figure 2:
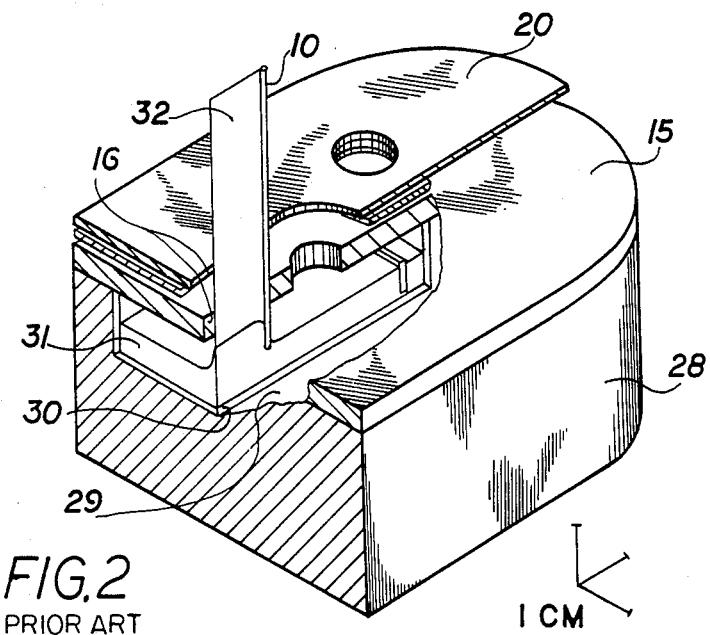
FIG. 2 is a half-section with portions cut away to show detail, of a typical growth system for dendritic web crystals.
Figure 3:
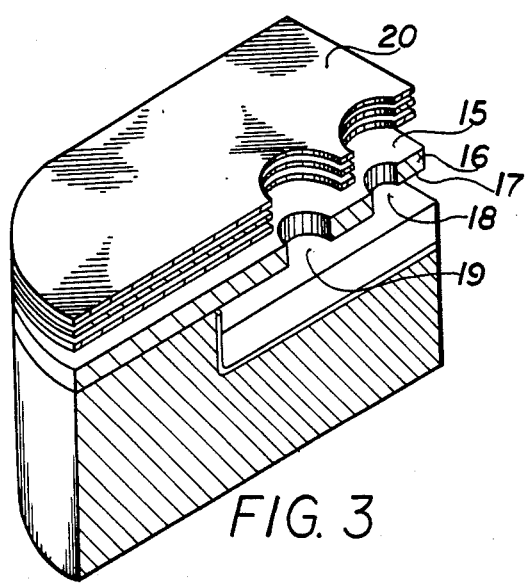
FIG. 3 is a quarter-section of one embodiment of the present invention.

The present invention consists of a specially designed lid and shield configuration which permits growth of silicon dendritic web at a predetermined width. The configuration also permits some adjustment of the desired width during growth. One embodiment of this configuration is shown in FIG. 3. As shown, the susceptor lid 15 has a relatively short slot region 16 which provides a hot bridge region 17 to reduce the lateral heat loss, and appropriately sized end holes 19 spaced a predetermined distance from the ends of the slot 16 and adjacent the boundaries of the dendrite web, to control the intrinsic thermal gradient in the melt. As shown in FIG. 3, the slot region 16 connects with an enlarged circular end region 18. This end region 18 permits symmetrical heat loss around the dendrites, and is generally symmetrical about the dendrite. Additional control of the thermal gradient in the melt is provided by the size of the circular end region 18 of the slot 16. As shown in FIG. 3, the configuration embodies radiation shielding 20 above the lid proper, although the number and spacing of the shields 20 may vary according to other thermal requirements of the growth. As shown in FIG. 3, the radiation shields 20 are configured to fit in register over the top of the susceptor lid 15 such that the slot region 16, end holes 19, and end region 18 remain uncovered.

The principles embodied in this design are to control width primarily by controlling the lateral heat loss from the edges of the ribbon. If only a short slot 16 is used, then the surface temperature profile of the melt is so dipped as to make the growth unstable even though the lateral loss is not reduced. The addition of the end holes 19 to the design modifies the melt temperature so that a stable growth is possible. The width at which control is achieved is determined by the dimensions of the slot 16 and end holes 19 and the distance the end holes 19 are spaced from the slot 16. Since there may still be a shallow temperature "trough" at the melt surface, the precise crystal width within a small range can be fine tuned by small adjustments of the system temperature.

Figure 4:
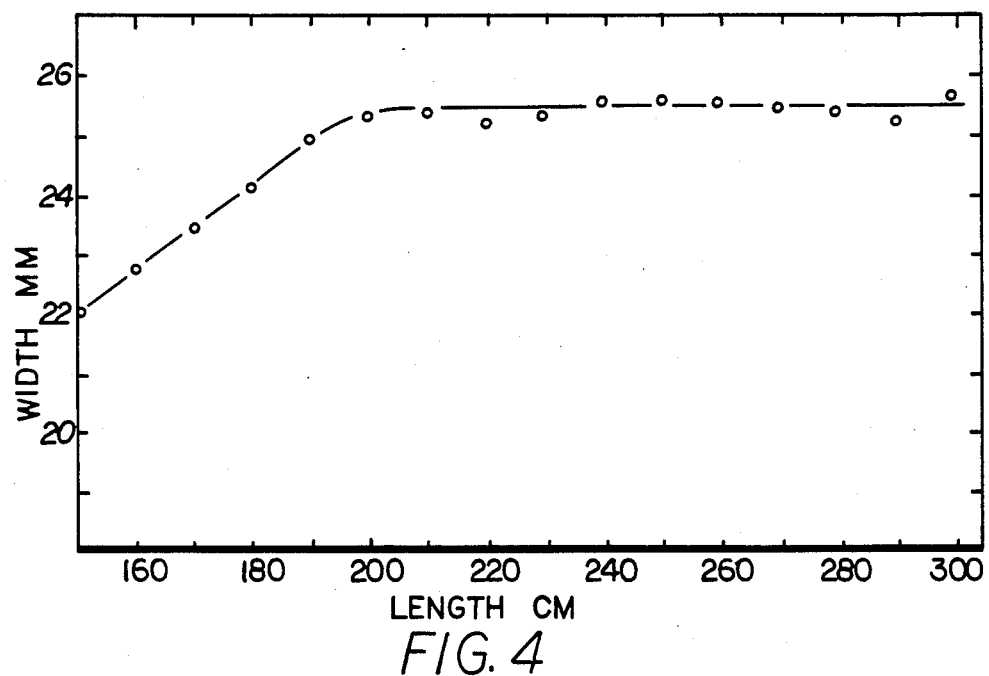
FIG. 4 is a graph comparing width versus length for a crystal growth using the present invention.

FIG. 4 shows the width as functions of length for a crystal grown using the growth configuration of FIG. 3. The crystal maintains its width within ±0.5 millimeters for well over a meter of growth. Some of the fluctuation which occurred was the result of the same temperature changes made by the operator. Other crystals grown with this configuration reproduce the width/length characteristics as shown to lengths of 5 meters of constant width. By intentionally introducing small changes in the system temperature, the crystal may be made to widen or narrow, so that the growth at specific width is achieved without detriment to overall growth stability.

Figure 5:
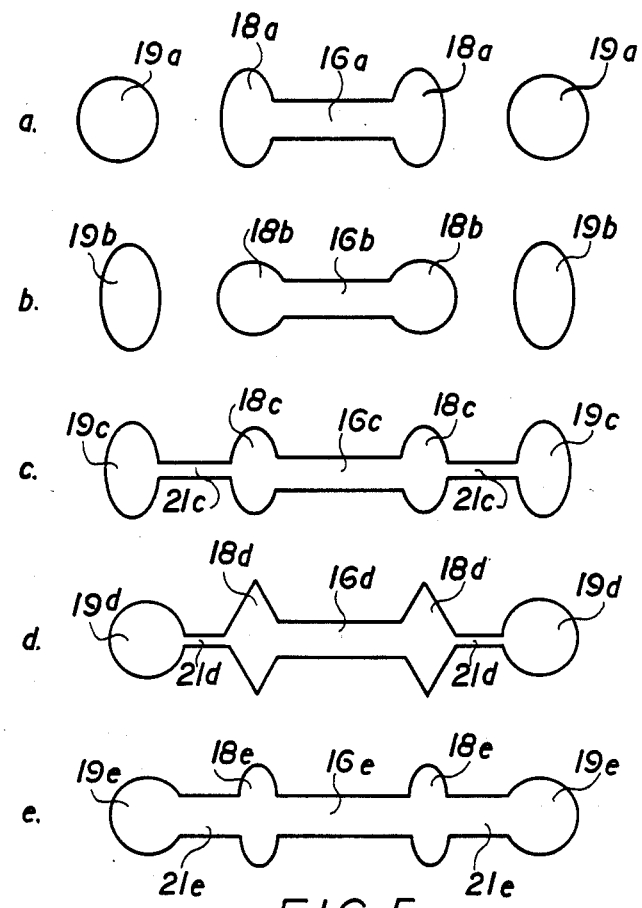
FIGS. 5a-e is a schematic diagram which demonstrates several additional examples of lid-slot geometries used in the present invention.

The example discussed above and illustrated in FIG. 3 should not be construed to impose limitations on the concept of this invention. Other configurations embodying this concept may be used to control the width of the web crystal. A few examples of other lid slot geometries are shown in FIG. 5. Each of these configurations permit control of the heat loss pattern in the region of the web crystal, the bounding dendrites and over the melt surface in and beyond the web growth region by adjusting the size and shape of the slot pattern, and thus represent passive control of the web width. As shown in FIG. 5, all of the lid slot geometries have several things in common. First, each comprises a slot region 16a-e bounded on either end by end regions 18a-e. While these end regions were previously described as circular, as shown in FIG. 5 they may be oblong, diamond-shaped, oval, or any other shape which suits the particular application. In any event, the end regions 18a-e are generally symmetrical about the boundaries of the web. Also, as shown in FIG. 5, each of the lid slot geometries contains end holes 19a-e. Again, these end holes may, but need not, be circular. For example, FIGS. 5b and 5c demonstrate oval end holes. Additionally, it would be possible to practice the present invention by providing more than one end hole 19 at each end of the slot 16. As shown in FIGS. 5c through 5e, the end holes 19 are joined to the end region 18 by means of a secondary slot region 21c-e. As shown, this secondary slot region 21 may be of varying width depending on the particular needs of the system.

Another method of carrying out the present invention is demonstrated in FIG. 6. For example, given a configuration which produces the desired temperature profile in the melt, the heat loss pattern from the dendrites can be controlled by adding heat to the dendrite edge 11 with a focused radiative heat source 22, thus decreasing the losses from the dendrite edge 11 in order to approach a more symmetrical heat loss pattern from the dendrite tip.

As shown in FIG. 7, the heat loss pattern can also be altered by increasing the heat losses from the dendrite faces 23 using gas jets 24. As shown, the gas jets 24 can be used to cool the dendrite faces 23 in order to approach symmetrical heat loss conditions around the dendrite.

FIG. 8 represents a top view of a typical dendritic web system with dendrites 10 being pulled through the slot 16 in the susceptor lid 15.

As shown in FIG. 8, radiation ports 25 in the susceptor lid 15 can also be used to increase losses from the dendrite faces 23. As shown, these radiation ports 25 extend outwardly from the slot 16 of the susceptor lid 15 to the outer edge 33 of the susceptor lid. The radiation ports, as shown, extend from a region in the slot 16 adjacent the region through which the dendrites, or boundaries of the dendritic web, are pulled. Radiation ports could also be positioned along the sides of the susceptor, positioned adjacent the dendritic web boundaries to further control temperature gradients at the boundaries.

Inversely, given a slot design which controls the heat loss pattern from the dendrites, the temperature distribution in the melt could be controlled with radiation ports 27 extending out the bottom of the susceptor 28 or by appropriate radiation shielding, as shown in FIG. 9. As shown in FIG. 9, the radiation ports 27 extend from the susceptor cavity 29 through the susceptor bottom 34. The radiation ports 27 permit heat loss from the melt, and are positioned at a location in the susceptor 28 such that the melt temperature profiles in the melt can be controlled. As shown in FIGS. 8 and 9, this location generally coincides with the location of the end holes 19 in the susceptor lid 15.

What is claimed is:

1. An apparatus for growing silicon dendritic web crystals comprising:

a. a susceptor having a cavity containing a crucible in which silicon can be melted and maintained in molten state;
   b. a lid positioned over the crucible with a slot therein through which a dendritic web crystal can be pulled, said slot having a configuration with enlarged end regions adjacent the boundaries of a dendritic web pulled through the slot such that the temperature gradients in the web at the boundaries can be controlled, said lid further having end holes at either end of said slot, said end holes appropriately sized and spaced from the ends of said slot such that the intrinsic temperature gradients in the molten silicon can be controlled; and
   c. a radiation shield spaced above said lid with a slot through which a dendritic web crystal can be pulled, said slot having a configuration with enlarged end regions adjacent the boundaries of the dendritic web such that the temperature gradients at the boundaries of the web can be controlled, said shield further having end holes at either end of said slot, said end holes appropriately sized and spaced from the ends of said slot such that the intrinsic temperature gradients in the melt can be controlled so as to permit growth of a dendritic web crystal having a substantially constant width over its length.

2. An apparatus for growing silicon dendritic web crystals as set forth in claim 1 wherein the enlarged end regions of the slots of the lid and the radiation shield adjacent the boundaries of the web are symmetrical about the boundaries of the web.

* * * * *